United States Patent [19]

Dallabora et al.

[11] Patent Number: 5,267,202
[45] Date of Patent: Nov. 30, 1993

[54] READING DEVICE FOR EPROM MEMORY CELLS WITH THE OPERATIONAL FIELD INDEPENDENT OF THE THRESHOLD JUMP OF THE WRITTEN CELLS WITH RESPECT TO THE VIRGIN CELLS

[75] Inventors: Marco Dallabora, Melegnano; Paolo Rolandi, Volpedo; Marco Maccalli, Novate Milanese, all of Italy

[73] Assignee: SGS-Thomson Microelectronics s.r.l., Milan, Italy

[21] Appl. No.: 725,987

[22] Filed: Jul. 5, 1991

[30] Foreign Application Priority Data

Jul. 6, 1990 [IT] Italy .............................. 20877 A/90

[51] Int. Cl.⁵ .............................................. G11C 11/40
[52] U.S. Cl. ................................. 365/189.09; 365/226
[58] Field of Search ..................... 365/189.09, 226, 185

[56] References Cited

U.S. PATENT DOCUMENTS 5,025,417 6/1991 Miyamoto et al. ............. 365/189.09

Primary Examiner—James B. Mullins
Attorney, Agent, or Firm—Seed and Berry

[57] ABSTRACT

The device comprises a source bias generator suitable for conferring upon the EPROM cell during the reading step a source voltage that varies linearly with the power supply voltage so as to keep constant the voltage between gate and source of the above cell.

20 Claims, 3 Drawing Sheets

READING DEVICE FOR EPROM MEMORY CELLS WITH THE OPERATIONAL FIELD INDEPENDENT OF THE THRESHOLD JUMP OF THE WRITTEN CELLS WITH RESPECT TO THE VIRGIN CELLS

DESCRIPTION

The present invention relates to a reading device for EPROM memory cells with the operational field independent of the threshold jump of the written cells with respect to the virgin cells.

In EPROM memory cells with a double level of polysilicon, that is, with the control gate superimposed through an intermediate dielectric layer over a floating gate in turn superimposed through an oxide layer over a channel region defined by diffusions of source and drain in a semi-conductor substrate, the reading of the cell can be executed in a direct manner by applying an appropriate power supply voltage across the control gate and, through a load element, a reduced voltage across the drain and in case of conduction detecting the state of the virgin cell, in case of interdiction the state of the written cell. Conduction takes place when the reference current through the load element is higher than a given constant value.

Such a direct reading method has a limitation represented by the fact that for a correct and safe reading the control gate voltage (hereinafter called merely <<gate voltage>>) must remain within the ambit of a range of values having a width equal to the threshold jump between the virgin cell and the written cell. A gate voltage lower than the conduction threshold of the virgin cell or higher than that of the written cell would not allow one to be distinguished from the other, so that in the first case there would be an absence of conduction and in the second case a conduction which could mean a virgin cell or a written cell indifferently. It should also be kept in mind that such a range, having essentially a constant width, can be at higher or lower values of voltage in relation to the characteristics of the cell and of the load element.

Only this latter drawback may be eliminated through the use of a differentiated structure with unbalanced loads or with current offsets wherein the cell to be read is connected through a converter to one of the inputs of a differential detection amplifier, to whose other input, again through a converter, there is connected a virgin reference cell with the same characteristics.

Structures of this type allow the distinction to be made between the state of a virgin cell and that of a written cell in the form of opposite unbalances of the detection amplifier.

Such solutions, however, do not solve the problem of the limitation of the range of values to the threshold jump, which is only in part attenuated using converters accomplished so as to determine reference currents that vary with the power supply voltage.

In fact, it is possible with unbalanced loads to obtain only a limited increase in the maximum gate voltage, while with a current offset it is the minimum gate voltage that cannot fall below a given value.

The object of the present invention is to overcome the mentioned drawbacks with a reading device whose operational field is independent of the threshold jump of the written cells and that does not suffer from further problems.

According to the invention such object is attained with a reading device for EPROM memory cells comprising a semi-conductor substrate with source and drain diffusions suitable for defining a channel region over which there is superimposed a floating gate and then a control gate with interposition of intermediate dielectric, characterized in that it comprises a source bias generator suitable for conferring upon the EPROM cell during the reading step a source voltage that varies linearly with the control gate voltage so as to keep constant the voltage between control gate and source.

There is thus obtained a reading device wherein there is no limitation related to the range of values within which the gate voltage must be kept for a correct reading and wherein the problems related to the other devices are overcome according to the known art.

It appears, in fact, evident that a gate-source voltage kept constant in this way at a suitably pre-determined voltage will never be higher than a maximum voltage such as the threshold voltage of the cell for any value, however high it may be, of the power supply voltage and thus of the gate voltage. Any rise in the gate voltage shall be at once compensated by a similar rise of the source voltage, while the gate-source voltage shall remain constant at the pre-set value.

The features of the present invention shall be made more evident by an embodiment illustrated as a non-limiting example in the enclosed drawings, wherein.

Figure 1:
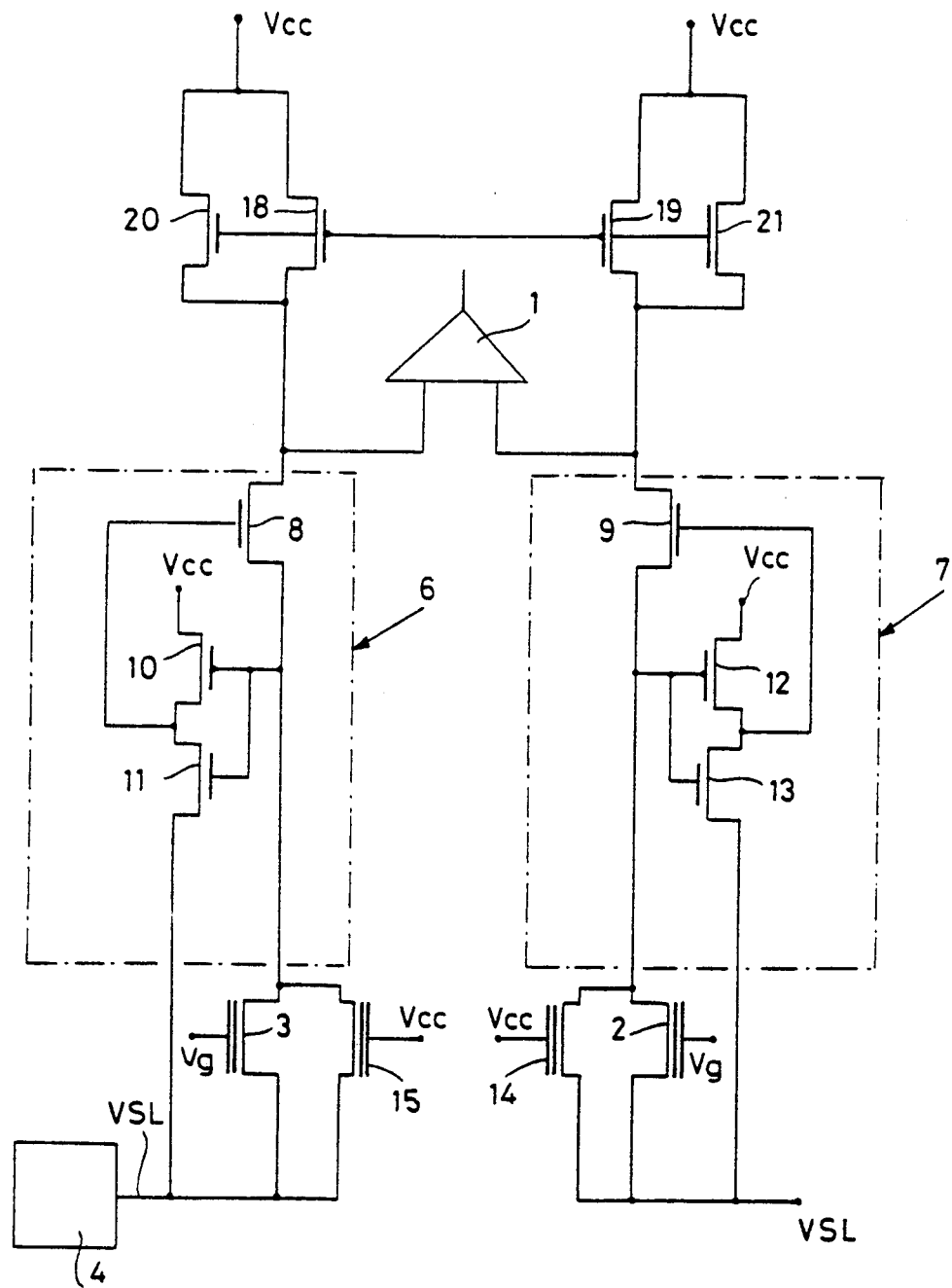
FIG. 1 shows the electrical diagram of a differential-type reading device accomplished according to the present invention, considered in application to a single EPROM cell.

With reference to FIG. 1, the electrical diagram of the reading device comprises a differential detection amplifier 1 whose inputs, with the interposition of N-channel MOS transistors 8, 9 forming part of control units 6, 7 that shall be described later, are connected to the drains of an EPROM matrix cell 2 and of an EPROM reference cell 3, respectively. The gates of cells 2, 3 are supplied at a voltage Vg equal to the power supply voltage Vcc, while the sources are connected to the output at the voltage VSL of a source bias generator 4.

The abovementioned control units 6, 7 have the task of keeping constant the difference between the respective drain and source voltages of the cells 2, 3. In addition to the transistors 8, 9 such units 6, 7 comprise respective series of transistors 10, 11 (the first of the P-channel type, the second of the N-channel type) and 12, 13 (ditto), whose gates are connected together and to the sources of the transistors 8, 9, respectively. The source of the transistor 10, in series with the drain of the transistor 11, and the source of the transistor 12, in series with the drain of the transistor 13, are connected to the gates of the transistors 8 and 9, respectively, while the sources of the transistors 11, 13 are connected to the output of the source bias generator 4, respectively.

In series with the control units 6, 7 there are connected the sources of the N-channel load transistors 18, 19, whose drains are kept at the power supply voltage Vcc and whose gates are connected together and to the gates of the P-channel MOS transistors 20, 21 placed in parallel to them, which have the task of balancing the current absorbed by bias cells 14, 15, whose purpose shall be explained later.

Figure 3:
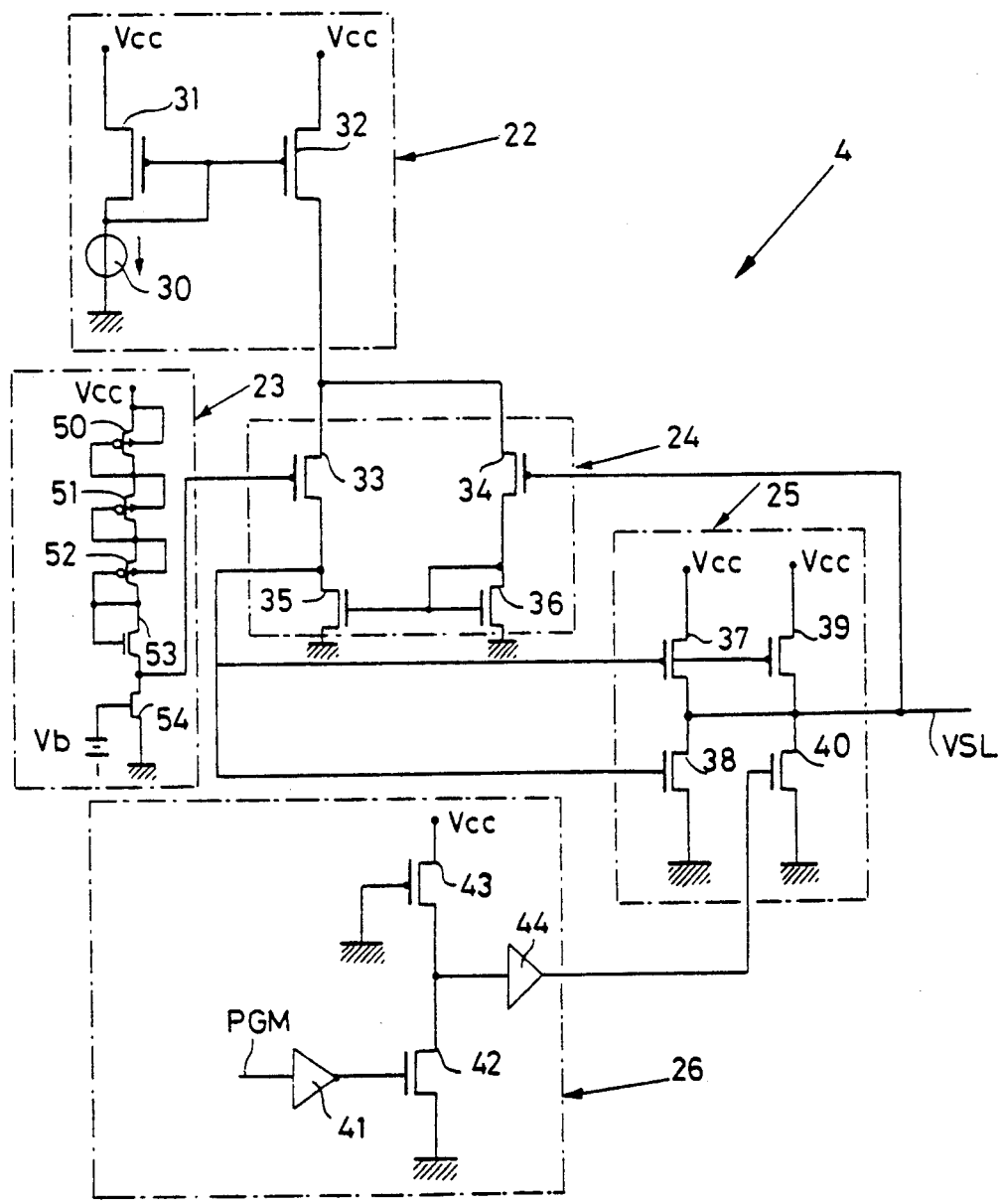
FIG. 3 shows the electrical diagram of a possible embodiment of the source bias generator included in the above device.

With reference to FIG. 3, each of the bias generators 4 comprises as an example a unit 22 for generating current and a unit 23 for generating the reference voltage for a comparator 24. At the output from the comparator 24 there is a control unit 25, whose output voltage VSL, representing the gate voltage of the bias cells 14, 15, is fed back to the comparator 24. With the control unit 25 there is also associated an auxiliary circuit 26, that has the task of keeping the source voltages of the EPROM cells 2 and 3 at the value of the substrate (that is, 0) during the programming steps.

The current generator 22 comprises a generator of ideal current 30 interposed between ground and the source of a P-channel MOS transistor 31, whose gate is connected to the source and the drain is connected to the power supply Vcc. The gate of transistor 31 is connected to the gate of a further P-channel MOS transistor 32, whose drain is connected to the power supply Vcc and whose source represents the output of the generator unit 22 and the input of the comparator 24.

The generator of the reference voltage 23 comprises a series of three MOS diode-connected transistors 50, 51, 52. The drain of the transistor 50 is connected to the power supply Vcc, while the gate is connected to the source of the same and to the drain of transistor 51. The gate of the transistor 51 is connected to the source of the same and to the drain of the transistor 52. The gate of the transistor 52 is connected to the source of the same and to the drain and gate of an EPROM cell 53. The source of the cell 53 is connected to the drain of an N-channel transistor 54 whose gate is kept at a reference voltage Vb. The source of the transistor 54 is grounded. The voltage taken across the source of the cell 53 represents the output of the voltage generator 23 and the input of the comparator 24.

The comparator 24 comprises a P-channel MOS transistor 33, whose gate is kept at the reference voltage at the output of the voltage generator 23, while the drain is connected to the output of the unit 22 and to the drain of a further transistor 34. The sources of the transistors 33, 34 are connected to the drains of the N-channel transistors 35, 36, whose sources are grounded and whose gates are connected together. The drain of the transistor 36 is also connected to the gate of the same.

The drain of the transistor 35 is connected to the input of the control unit 25 and actually to the gates of a series formed by a P-channel transistor 37 and by an N-channel transistor 38. The drain of the transistor 37 is connected to the power supply Vcc and the source is connected to the drain of the transistor 38, whose source is grounded. The control unit 25 comprises a further series of a P-channel transistor 39, whose drain is connected to the power supply Vcc, while the gate is connected to the gate of the transistor 37 and the source is connected to the drain of an N-channel transistor 40. The source of the transistor 40 is grounded, while the gate is controlled by the output signal of the auxiliary circuit 26.

The circuit 26 comprises an inverter 41, at whose input a PGM signal is applied and whose output is connected to the gate of an N-channel MOS transistor 42, whose source is connected to ground and whose drain is connected to the source of a P-channel transistor 43, whose gate is connected to ground and whose drain is connected to the power supply Vcc. The source of the transistor 43 is also connected to the input of a further inverter 44, whose output is connected to the gate of the transistor 40.

If the loads 18, 19 are unbalanced and in particular if the load 19 is greater than the load 18, the operation of the reading device takes place in a known manner applying the power supply voltage Vcc across the gates of the virgin reference cell 3 and of the matrix cell 2 of which it is required to check the state and going on to read the output of the differential amplifier 1. If the EPROM matrix cell 2 is virgin there will be an unbalance at the two inputs of the detection amplifier 1 that is indicative of such a situation. But if it is the case of a written cell, its non-conduction shall determine an unbalance of the opposite sign which shall in turn be indicative of this state. In the absence of the bias generator 4 special attention should be paid to the values of Vcc and thus of the gate voltage applied across the cells 2, 3. In such a case, in fact, until Vcc remains in a range of values defined by the threshold voltages of a virgin cell and of a written cell the simultaneous conduction of the cells 3, 2 indicates that the matrix cell 2 is virgin, while the interdiction of the matrix cell 2 indicates the state of a written cell; but if a value of Vcc is reached that is higher than a given value, corresponding to the conduction threshold of a written cell, the systems falls into a state of indetermination in which the matrix cell 2 conducts in a manner independent of its state.

To resolve such reading ambiguity the source bias generator 4 has been introduced, which has the task of keeping constant the voltage between gate and source of the EPROM cells 2, 3 with the variation of the power supply voltage Vcc and thus of the gate voltage.

Figure 2:
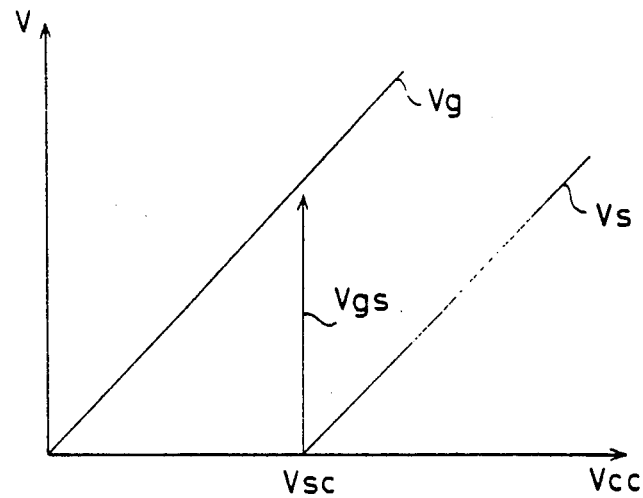
FIG. 2 shows the curves of the gate and source voltages of said EPROM cell with the variation of the power supply voltage.

The generator 4 through the comparator 24 makes a comparison between the output voltage VSL and the reference voltage generated by the generator 23, which as already said rises together with the power supply voltage Vcc beginning at a pre-determined trigger threshold, so as to produce through the control unit 25 a voltage VSL which controls the sources of the EPROM cells 2 and 3 so that, starting at a trigger threshold Vsc, the source voltage of the above cells rises linearly with Vcc keeping constant the difference Vgs between the gate voltages Vg and the source voltages Vs of the respective cells 2, 3. As illustrated in FIG. 2, in this way, even though the power supply voltage Vcc is increased and with it the gate voltage Vg, the gate-source voltage Vgs of the EPROM cells 2, 3 remains constant and does not ever go above the threshold voltage of the written cell and thus determining a situation of uncertainty in the assessment of the state of the cell during the reading step.

The auxiliary circuit 26 provided in the generator 4 operates during the programming step of the cell 3 so as to keep the source connected to the substrate, that is, at 0 volts.

Figure 4:
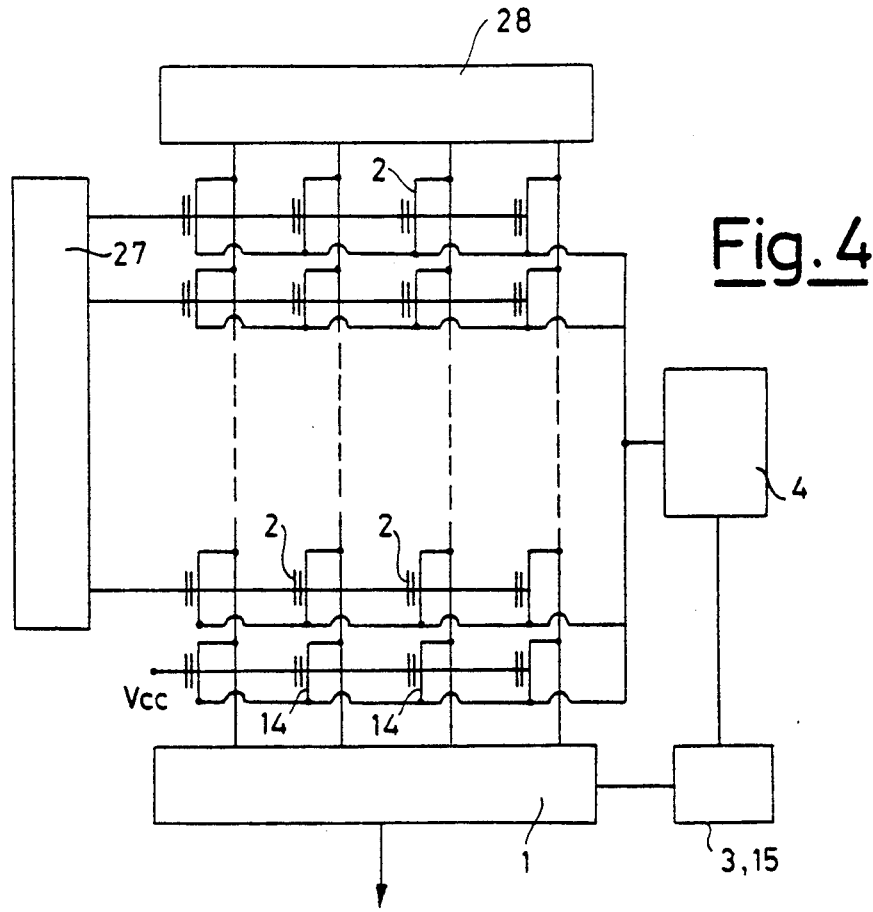
FIG. 4 shows the generalization of the device according to the invention for a whole matrix of EPROM cells.

With reference to FIG. 4, the reading device according to the present invention is applicable to a number of EPROM cells organized in a matrix. In such cases there is a row decoder 27 connected to the gates of the matrix cells 2 and a column decoder 28 connected to the drains of the matrix cells 2. The sources of the matrix cells 2 are connected to the generator of the source bias voltage 4 which also controls the gates of the bias cells 14 and 15. These have the object of keeping the matrix columns connected to the node VSL in the situations wherein the columns themselves are not driven by the decoder 28 avoiding their discharge through the Leakage currents of the junctions at the substrate's voltage value with problems of additional consumption and slowing down during the pre-loading step of the columns themselves.

The drains of the matrix cells 2 and of the reference cells 3 represent, in a manner similar to what has been illustrated with reference to the previous figures, the inputs of the differential amplifier 1.

The reading process of any matrix cell 2 is altogether similar to that illustrated previously with reference to FIG. 1, naturally taking into account that the selection of the cell to be read takes place by means of the pair of decoders 27, 28.

We claim:

1. A reading device for memory cells comprising a semiconductor substrate with source and drain diffusions defining a channel region over which a floating gate, an intermediate dielectric layer, and a control gate are superimposed characterized in that it comprises:
   a source bias generator that provides the memory cell during a reading step a source bias voltage that varies linearly with a control gate voltage so as to keep constant the voltage between the control gate and the source.

2. The device according to claim 1, characterized in that with said memory cell there is associated during the reading step a reference cell also connected to said generator of the source bias voltage, the drains of the memory cells being the inputs of a differential amplifier whose output allows the determination of the state of the cell.

3. The device according to claim 2 characterised in that said generator of the source bias voltage comprises a current generator and a reference voltage generator both connected to a comparator, the reference voltage generator being connected to an input of the comparator and
   a control unit that outputs the source bias voltage and which has an input connected to an output of the comparator and an output connected in feed-back to an input of the comparator for its comparison with said reference voltage.

4. The device according to claim 3 in which the comparator includes:
   first and second p-channel transistors, the sources of which are connected to the current generator, the gate of the first p-channel transistor being one input of the comparator and being connected to the reference voltage generator and the gate of the second p-channel transistor being another input of the comparator and being connected to the output of the control unit which is provided as a feedback to the input of the comparator.

5. The device according to claim 3 further including:
   an auxiliary control circuit providing an input to the control unit;
   a programming input signal terminal on the control unit to which a programming signal is applied during programming for generating an output signal from the auxiliary control circuit which forces the output of the source bias generator to the substrate voltage during programming to maintain the source of the memory cell at the substrate voltage during programming.

6. The device according to claim 1, characterised in that said memory cells are organized in a matrix structure, and further including
   a row decoder means and a column decoder means for selecting the cell to be read, and with each column of said memory cells there is associated a bias cell forming part of a row of bias cells with the source connected to said generator of the source bias voltage.

7. The reading device according to claim 1 wherein said memory cells are EPROM memory cells.

8. A semiconductor device comprising:
   a memory cell having source and drain diffusions therein and a channel formed between the source and drain diffusions;
   a floating gate overlying the channel region;
   an electrical insulator overlying the floating gate;
   a control gate overlying the floating gate and having the electrical insulator interposed between the control gate and the floating gate, the structure being a semiconductor memory cell;
   a source voltage bias generator electrically connected to the source diffusion of the memory cell;
   a control circuit within the source voltage bias generator that causes the source voltage bias generator to output a voltage that varies linearly with the control gate voltage above a pre-determined trigger threshold voltage to maintain the voltage potential between the control gate and the source at a constant value during reading of data from the memory cell.

9. The device according to claim 8 wherein the memory cell is a EPROM memory cell.

10. The device according to claim 8 further including:
    a differential amplifier having two inputs;
    a reference cell having a source diffusion and a drain diffusion, whose output is provided to one of the inputs of the differential amplifier; and
    the other input to the differential amplifier being provided from the memory cell, said source voltage bias generator being connected to the source diffusion of the reference cell to maintain the voltage on the source diffusion of the reference cell at the same potential as the voltage at the source of the memory cell.

11. The device according to claim 8 in which said voltage bias generator circuit includes:
    a comparator having two inputs;
    a reference voltage generator having an output that is electrically connected to an input of the comparator;
    a control unit whose output is electrically connected to the second input of the comparator, the output of the comparator being provided as an input to the control unit so that the output of the control unit is connected in feedback as an input to the comparator for comparison with the reference voltage, the output of the control unit being provided as the output from the source voltage bias generator.

12. The device according to claim 11 in which the output of the reference voltage generator rises together with the control gate voltage when the control gate voltage is above the predetermined trigger threshold level so as to provide an output from the source voltage bias generator that rises linearly with the rise in the control gate voltage and maintains a constant value of the difference between the control gate voltage and the source voltage when the control gate voltage is above said predetermined trigger threshold voltage.

13. The device according to claim 11 further including a current generator connected to an input to said comparator for providing input power to said comparator, and said comparator includes a pair of p-channel transistors having their sources tied together and receiving at their input the output of said current generator and one of said p-channel transistors providing at its drain the output of said comparator, which is provided as the input to said control unit.

14. The device according to claim 8 in which said source voltage bias generator further includes:
  a auxiliary control circuit having an input terminal and an output terminal, the auxiliary control circuit forcing the source voltage bias generator output to the substrate voltage when a program signal is applied at the input terminal of the auxiliary control circuit so that the source diffusion of the memory cell will be held at the substrate voltage during the programming of the memory cell.

15. The device according to claim 8 further including:
  a column line connected to the drain region of the memory cell;
  a column decoder that selectively drives the column line; and
  a bias cell having a source region and a drain region, the source region of the bias cell being electrically connected to the source region of the memory cell and the drain region of the bias cell being electrically connected to the drain region of the memory cell and the gate of the bias cell being connected to a high voltage when the column decoder is not driving the column line to maintain the drain region of the memory cell at approximately the voltage potential of the source voltage bias generator when the drain region of the memory cell is not driven by a column decoder.

16. A means for improving the reading of data from memory cells, each of the memory cells having a source diffusion and a drain diffusion, a channel region, a floating gate overlying the channel region, an insulating layer overlaying at least a portion of the floating gate and a control gate overlaying at least a portion of the dielectric layer and the floating gate comprising:
  a source voltage generator means electrically connected to the source diffusion of the memory cell for maintaining said source diffusion at a selected voltage; and
  a control means within said source voltage generator means for generating a voltage output of said source voltage generator means that varies linearly with the control gate voltage when the control gate voltage is above a threshold voltage so as to maintain a constant voltage between the control gate and the source during reading of data from the memory cell.

17. The device according to claim 16 wherein said control means includes comparator means having two inputs, one input being electrically connected to a reference voltage generator means and the other input being connected to a control unit means, the output of the comparator means being provided as an input to the control unit means in a feedback relationship for comparison to the output of said reference voltage generator means.

18. The device according to claim 17 wherein the voltage output by said reference voltage generator means includes means for varying the output of the reference voltage generator when the gate voltage is above a predetermined trigger threshold voltage causing the control means to provide an output voltage which controls the voltage on the source of the memory cell above the value of the predetermined trigger threshold voltage and rises linearly with the gate voltage above the predetermined trigger threshold voltage to maintain a constant difference between the gate voltage and the memory cell source voltage when the gate voltage is above the predetermined trigger threshold voltage.

19. The device according to claim 18 wherein each of said memory cells is a EPROM memory cell and further including:
  means for maintaining the source of said EPROM memory cell at substrate voltage during programming of said EPROM;
  a differential amplifier for reading data from said EPROM; and
  a EPROM reference cell connected as an input to said differential amplifier for use in reading data from said EPROM memory cell.

20. The means according to claim 16 further including:
  a row decoder;
  a column decoder;
  a plurality of memory cells formed in a matrix and having the sources of the memory connected to the source voltage generator means and the drain connected to a column line; and
  a bias cell having a source and a drain, the source voltage generator means being connected to the source of the bias cell and the drain being connected to the column line such that when the bias cell is on, the column line is at approximately the same voltage as the output of the voltage generator means.

* * * * *